PUSH-PULL TUNNEL DIODE AMPLIFIER

Filed June 28, 1967 4 Sheets-Sheet 1

INVENTOR:
CHONG W. LEE
BY Marvin L. Lederberg
HIS ATTORNEY.

INVENTOR:
CHONG W. LEE
BY Marvin L. Goldenberg
HIS ATTORNEY.

INVENTOR:
CHONG W. LEE
BY Marvin D. Goldenberg
HIS ATTORNEY.

INVENTOR:
CHONG W. LEE
BY Marvin L. [signature]
HIS ATTORNEY 3,533,008

PUSH-PULL TUNNEL DIODE AMPLIFIER

Chong W. Lee, North Syracuse, N.Y., assignor to General Electric Company, a corporation of New York Filed June 28, 1967, Ser. No. 649,500
Int. Cl. H03f 3/12, 3/54
U.S. Cl. 330—61 7 Claims

ABSTRACT OF THE DISCLOSURE

A tunnel diode amplifier circuit intended primarily for microwave application, wherein the dynamic range of stable operation is extended by 10 db or more over conventional tunnel diode amplifiers. The present circuit employs a pair of tunnel diodes connected in parallel for the input signal and in a balanced bridge configuration for the DC bias voltage. In addition, novel stabilizing circuitry is included which ensures stable operation of the amplifier.

BACKGROUND OF THE INVENTION

Field of the invention

The invention relates to the field of microwave amplifiers and, more particularly, tunnel diode amplifiers capable of providing a linear operation.

Description of the prior art

Tunnel diode amplifiers offer a number of advantages for microwave application over competing amplifier types, such as parametric amplifiers and traveling wave tube amplifiers. In particular, tunnel diode amplifiers have low power requirements, may be made small in size and at low cost and at present are the only devices capable of providing amplification above X-band. Most desirable, they may be readily adapted to microcircuit fabrication. However, present day tunnel diode amplifiers exhibit a limited dynamic range, i.e., the range of signal amplitude over which the power gain is maintained approximately constant. These amplfiers all employ a single tunnel diode in their circuitry. In order to provide improvement in dynamic range, it has been suggested to connect a pair of tunnel diodes in a push-pull configuration. The suggestion was first made by L. E. Dickens in an article entitled "Push-Pull Tunnel Diodes" appearing in the PGMTT Transactions, July 1961. Circuits of this nature, however, have been totally incapable of stabilization and until the present invention no one is known to have provided an operable embodiment.

SUMMARY OF THE INVENTION

It is accordingly an object of the present invention to provide a novel tunnel diode amplifier in which the dynamic range of operation is substantially extended over that previously obtainable.

Another object of the invention is to provide a novel tunnel diode amplifier connected in a push-pull configuration which is operable over a relatively wide dynamic range of operation and can be readily stabilized.

Another object of the invention is to provide a novel tunnel diode amplifier as above recited which extends the dynamic range of operation by at least 10 db over that previously attained.

A further object of the present invention is to provide a novel tunnel diode amplifier having reduced intermodulation product in the output.

A still further object of the invention is to provide a microwave tunnel diode amplifier as described which may be readily constructed as a strip line or coaxial structure, or in an integrated circuit form.

In accordance with these and other objects of the invention a pair of tunnel diodes of substantially matching electrical characteristics are connected in parallel with respect to an applied RF signal to be amplified, and in a balanced bridge configuration with respect to applied DC bias potential. Stabilizing networks are connected across the diode terminals so as to jointly stabilize the diodes and prevent the amplifier circuit from oscillating over a range of frequencies extending from DC to the resistive cut-off frequency, above which the diode cannot amplify. In a normal operation the cut-off frequency is about three times the signal operating frequency. Tuning networks are connected in the amplifier circuit which are employed to assist the stabilizing process, as well as for tuning to a desired signal. The tunnel diode amplifier circuit per se is connected to a circulator network for obtaining isolation between input and output of the two terminal amplifier circuit.

In one specific embodiment of the invention the stabilizing network includes a pair of stabilizing branches, the composite effect of said branches being to shunt the tunnel diodes with a positive conductance of a magnitude sufficient to prevent circuit oscillation at frequencies outside of the signal band. Accordingly, a first stabilizing branch is connected across the tunnel diodes for inserting in shunt with the tunnel diodes zero conductance at the signal frequency and a positive conductance at even multiples of the signal frequency. A second stabilizing branch is connected across the diodes for inserting in shunt therewith zero conductance at the signal frequency and a positive conductance at three times the signal frequency.

BRIEF DESCRIPTION OF THE DRAWING

The specification concludes with claims particularly pointing out and distinctly claiming the subject matter which is regarded as the invention. It is believed, however, that both as to its organization and method of operation, together with further objects and advantages thereof, the invention may be best understood from the description of the preferred embodiments, taken in connection with the accompanying drawings in which:

DESCRIPTION OF THE PREFERRED EMBODIMENTS

Figure 1:
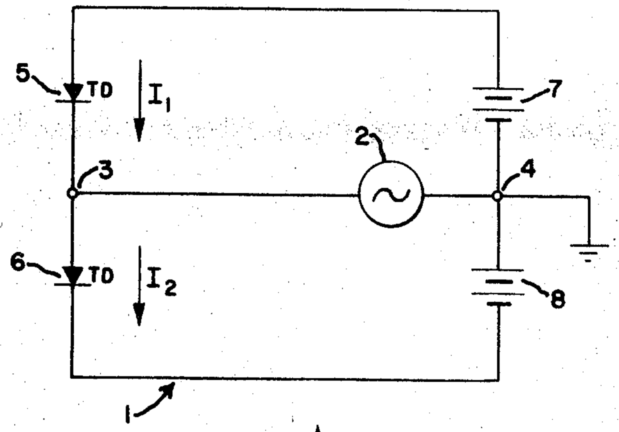
FIG. 1 is a schematic circuit diagram of a basic push-pull tunnel diode amplifier in accordance with the invention.

In FIG. 1 there is schematically illustrated a push-pull tunnel diode amplifier 1 having a configuration in accordance with the present invention, which circuit provides amplification of mircowave signals. The circuit extends the dynamic range over which microwave signals can be linearly amplified by a tunnel diode amplifier. A source 2 of signal energy is connected between terminals 3 and 4 of the amplifier circuit, the amplified output also being taken from these terminals as will be seen more clearly when considering the detailed circuit diagram of FIG. 3. A pair of tunnel diodes 5 and 6 of approximately matching electrical properties are connected in shunt with respect to the signal source 2, and in a balanced bridge configuration with respect to a pair of DC bias voltage sources 7 and 8. Accordingly, the positive terminal of DC source 7 is directly connected to the anode of diode 5, and the negative terminals of DC source 8 directly connected to the cathode of diode 6. The junction of sources 7 and 8 is connected to terminal 4, which is at ground. Source 2 supplies microwave energy typically from S to X-band, although operation is also obtainable considerably above X-band. The DC bias sources 7 and 8 supplies equi-potential voltages across the diodes 5 and 6.

As will be seen, the illustrated circuit configuration provides a composite V–I characteristic having a negative resistance region, the linear portion of which is appreciably extended as compared to that of a single diode. It is essential that the diodes 5 and 6 be in a balanced bridge configuration with respect to DC bias sources 7 and 8, i.e., that the signal source 2 be referenced to the same DC level as the junction of the batteries, DC ground in the instant configuration. This is necessary in order that the voltage vs. current characteristic for each diode combine to provide the noted composite V–I characteristic. A further advantage offered by the present circuit is that it can be stabilized over a range of frequencies extending from DC to resistive frequency cut-off, by techniques to be described when considering the detailed schematic circuit diagram of FIG. 3.

Figure 2A:
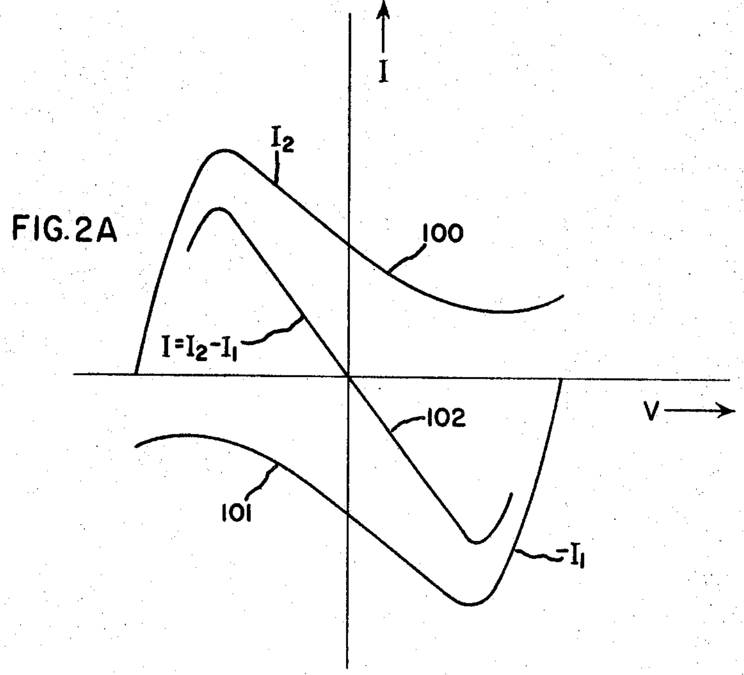
FIG. 2A are several curves illustrating current vs. voltage characteristics for the circuit of FIG. 1.
Figure 2B:
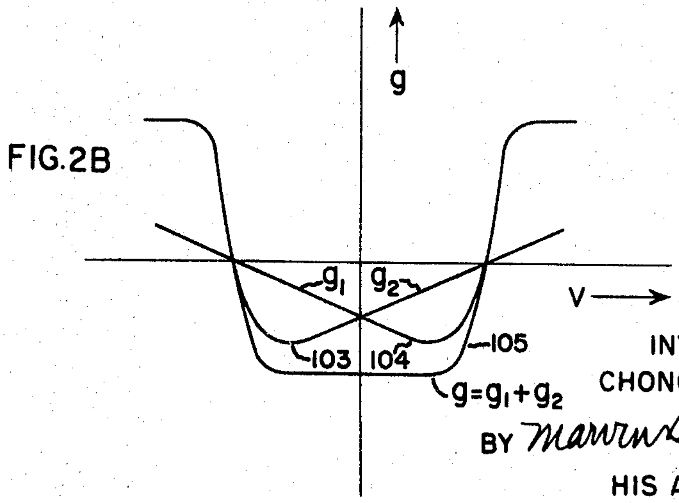
FIG. 2B are several curves illustrating conductance vs. voltage characteristics for the circuit of FIGURE 1.

The operation of the circuit of FIG. 1 will be described with reference to the curves shown in FIGS. 2A and 2B. In FIG. 2A there are illustrated the V–I characteristics for each of the diodes 5 and 6, as given by the curves 100 and 101, respectively. Thus, curve 100 is a plot of the current $I_2$ through the diode 6 as a function of the voltage V across terminals 3 and 4, and curve 101 is a plot of the current $-I_1$ through diode 5 as a function of voltage V. In addition, there is illustrated the composite V–I characteristic, presented by the curve 102, which is a plot of the current I as a function of V, where $I=I_2-I_1$. Accordingly, the V–I characteristic of the illustrated tunnel diode circuit as seen across the terminals 3 and 4 is given by the composite curve 102 which may be seen to have a linear negative resistance region appreciably extended as compared to the linear negative resistance region of each of the diodes taken individually.

By extending the negative resistance region in this manner, the range over which the conductance $g$ of the circuit is negative and linear is correspondingly extended. Referring to the curves of FIG. 2B, the conductance $g_2$ of the tunnel diode 6, which may be expressed as $$g_2=\frac{\partial I_2}{\partial V}$$

is illustrated by the curve 103. The conductance $g_1$ of the tunnel diode 5, given by the expression $$g_1=\frac{\partial I_1}{\partial V}$$

is illustrated by the curve 104. Further, the total conductance of the amplifier circuit $g$, which is given by the expression $g=g_1+g_2$, is illustrated by the curve 105. Since the amplification provided by the circuit depends upon a stable operation in the negative conductance region, and because for a linear operation of the circuit negative conductance must be essentially constant as a function of voltage, by extending the constant conductance region, the dynamic range of the amplifier is correspondingly extended.

Figure 3:
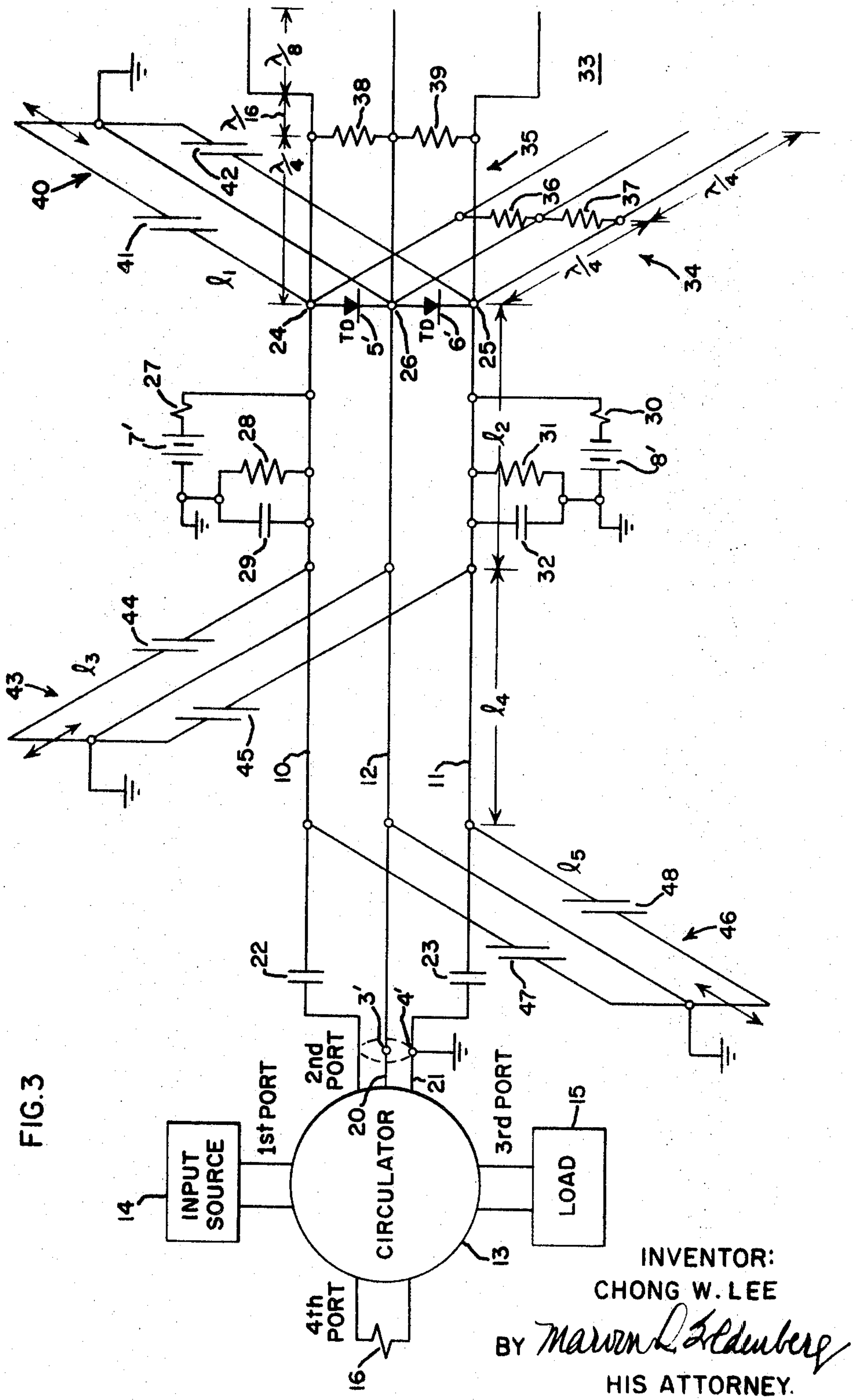
FIG. 3 is a detailed schematic circuit diagram of the present tunnel diode amplifier in combination with an input-output circulator network.
Figure 6A:
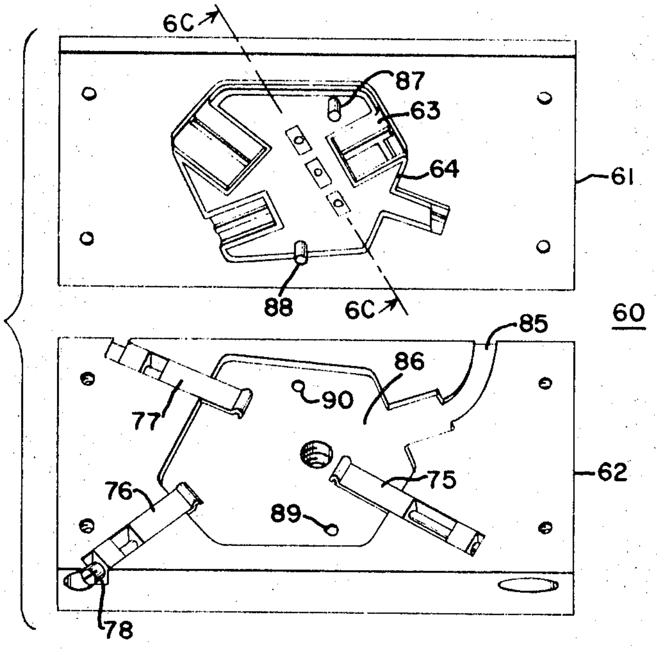
FIG. 6A is a perspective view of one exemplary strip line structure of the tunnel diode amplifier circuit of FIGURE 3.
Figure 6B:
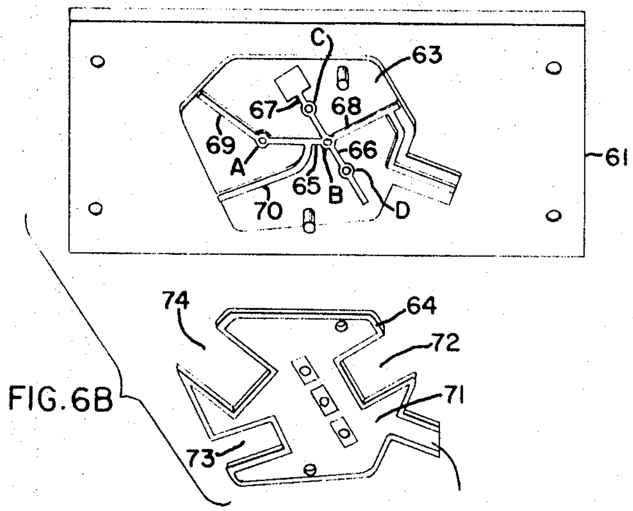
FIG. 6B is an exploded view of the strip line structure of FIGURE 6A.
Figure 6C:
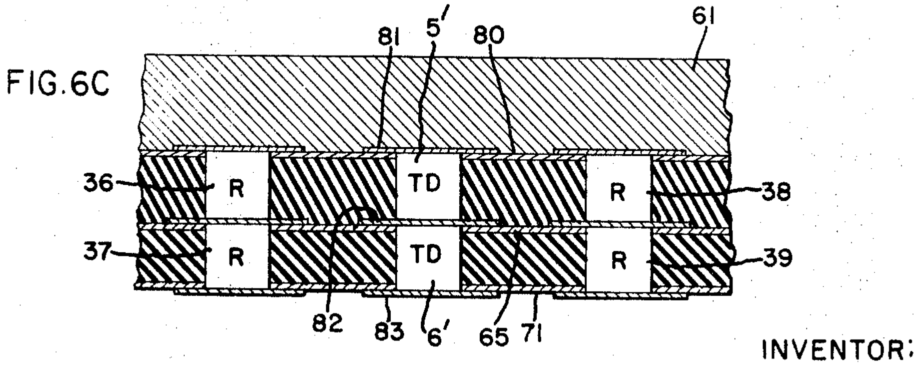
FIG. 6C is a cross sectional view of the tunnel diodes and stabilizing resistors as mounted in the illustrated structures, taken along the plane 6C—6C in FIG. 6A.

The amplifier circuit of the present invention is illustrated in a more complete form in the detailed schematic circuit diagram of FIG. 3. Although the invention is not so limited, the circuit is illustrated in a strip line configuration. The specific structure of an exemplary embodiment is shown in FIGS. 6A, 6B and 6C, to be described presently. Circuit components that are common to FIG. 1 are identified by similar reference characters, with an added prime notation. The tunnel diode circuit includes a pair of outer conductors 10 and 11 at RF ground potential and a center conductor 12, with tunnel diodes 5′ and 6′ connected across said conductors. A conventional four port circulator 13 is shown connected to the tunnel diode amplifier circuit for supplying thereto the input signal and receiving therefrom the amplified output signal. Signal energy from an input source 14 is coupled to the first port of the circulator. The second port is connected to input-output terminals 3′ and 4′ of the tunnel diode circuit. The third port is connected to a load 15, and the fourth port is connected to a termination impedance 16. In accordance with a well known operation of a circulator network, the energy applied to the input port is delivered to the second port and thereby coupled to the tunnel diode amplifier. The reflected energy, representing the amplified signal, is applied as an input to the second port and is delivered to the load via the third port. Energy that may be reflected from the load is dissipated in the termination impedance.

The connection between the second port of circulator 13 and the amplifier circuit is conveniently made by means of a coaxial connector, the inner conductor 20 of which is joined directly to center conductor 12 at terminal 3′. The outer conductor 21, DC grounded at terminal 4′, is commonly connected to conductors 10 and 11 through RF bypass capacitors 22 and 23, which isolate DC ground from the conductors 10 and 11. The tunnel diodes 5′ and 6′ are connected at some distance down the line from terminals 3′ and 4′. The anode of diode 5′ is connected to conductor 10 at terminal 24 and the cathode of diode 6′ is connected to conductor 11 at terminal 25. The cathode of diode 5′ and the anode of diode 6′ are connected to conductor 12 at terminal 26. The DC bias source 7′ has its negative terminal directly connected to ground and its positive terminal connected through bias resistor 27 to conductor 10. In shunt with source 7′ is the parallel connection of DC bias resistor 28 and RF bypass capacitor 29. Correspondingly, DC bias source 8′ has its positive terminal directly connected to ground and its negative terminal connected through bias resistor 30 to conductor 11. The parallel connection of DC bias resistor 31 and RF bypass capacitor 32 is connected in shunt with source 8′.

A stabilizing network 33 includes a pair of stabilizing branches 34 and 35 each coupled across the terminals 24, 25 and 26 of the tunnel diodes for stabilizing the circuit operation. The stabilizing branch 34 is open-ended and has a pair of stabilizing resistors 36 and 37 connected across the branch's center conductor and outer conductors at a distance one-quarter wavelength at the signal frequency from the open end and one-quarter wavelength from the tunnel diode terminals. Stabilizing branch 35 is also open-ended and has a pair of stabilizing resistors 38 and 39 located three-sixteenths wavelengths from the open end and one-quarter wavelength from the tunnel diode terminals. The three-sixteenths wavelength section is divided into two sub-sections of one-eighth wave length and one-sixteenth wavelength, respectively, with an impedance transformation of 2.41 inserted between these sections in a direction from the open end (providing a 45° rotation of the impedance coordinates on a Smith Chart). As is to be explained in greater detail, the stabilizing branch 34 applies a stabilizing conductance across the tunnel diode terminals at the even harmonics of the signal frequency, and a zero conductance at the fundamental frequency. The stabilizing branch 35 applies a stabilizing conductance across the tunnel diode terminals at particularly the third harmonic of the signal frequency, as well as at other harmonics, and a zero conductance at the fundamental frequency.

Also connected across the tunnel diode terminals 24, 25 and 26 is a tuning stub 40 shorted at its end and of adjustable length, the length being denoted as $l_1$. In the operable embodiment under consideration the shorted end is at DC ground, and a pair of RF bypass capacitors 41 and 42 appear inserted in the outer conductors. Spaced along the strip line conductors 10, 11 and 12 at a distance $l_2$ from the tunnel diode terminals is a second shorted tuning stub 43 of variable length $l_3$. The shorted end of stub 43 is also grounded and RF bypass capacitors 44 and 45 are included in the outer conductors. At a distance $l_4$ from the second tuning stub is connected a third shorted tuning stub 46 of variable length $l_5$, with its shorted end at DC ground and including a pair of RF bypass capacitors 47 and 48 in the outer conductors. The tunnel diode amplifier circuit being described is of the reflection type. The reflection coefficient $\Gamma$ of the circuit is equal to $E_R/E_I$, where $E_R$ is the voltage of energy progagating out of the terminals 3' and 4' and $E_I$ is the voltage of energy propagating into said terminals. The power gain of the circuit is given by $|\Gamma|^2$. It will be shown that if the tunnel diode amplifier is biased to exhibit a negative conductance the reflection coefficient $\Gamma$ will be greater than one and amplification therefore results. The reflection coefficient may be expressed in terms of admittance as $$\Gamma=\frac{Y_0-Y_L}{Y_0+Y_L} \quad (1)$$

where $Y_0$ is the characteristic admittance of the circulator, and $Y_L$ is the input admittance of the tunnel diode circuit looking into terminals 3' and 4'. $Y_L$ includes the admittance of the tunnel diode devices, per se, plus the admittance of the associated circuitry. With the tunnel diodes biased in the negative conductance region, $Y_L$ may be expressed as $-g+jb$. Accordingly, with the circulator admittance construed as having a negligible imaginary part, $\Gamma$ may be expressed as:

$$\Gamma=\frac{G_0-(-g+jb)}{G_0+(-g+jb)} = \left[\frac{(G_0+g)^2+b^2}{(G_0-g)^2+b^2}\right]^{1/2} \angle\theta \quad (2)$$

where $G_0$ is the characteristic admittance of the circulator. The power gain may be therefore given by the expression:

$$|\Gamma|^2=\frac{(G_0+g)^2+b^2}{(G_0-g)^2+b^2} \quad (3)$$

Accordingly, it is seen that the gain of the tunnel diode amplifier circuit is a function of the input admittance of the circuit. By adjusting the circuit input admittance the gain may be changed. This adjustment is normally made through the tuning circuit. It is necessary, however, that in adjusting the gain the circuit remain stable. The stabilizing network 33 assures that good stability of the circuit is provided over a wide range of operation, thereby permitting the necessary tuning to be accomplished without setting the circuit into an unstable oscillatory state.

The stabilizing network 33 has an admittance versus frequency characteristic such that the conductance exceeds the characteristic admittance of the strip line structure for all but the signal band frequencies. The admittance at the center of the signal frequency band is zero, rising to the characteristic admittance at the edges of the signal band. It is desirable that the stabilizing network exhibit a minimum conductance at the signal frequency so as not to appreciably dissipate the signal energy.

Figure 4:
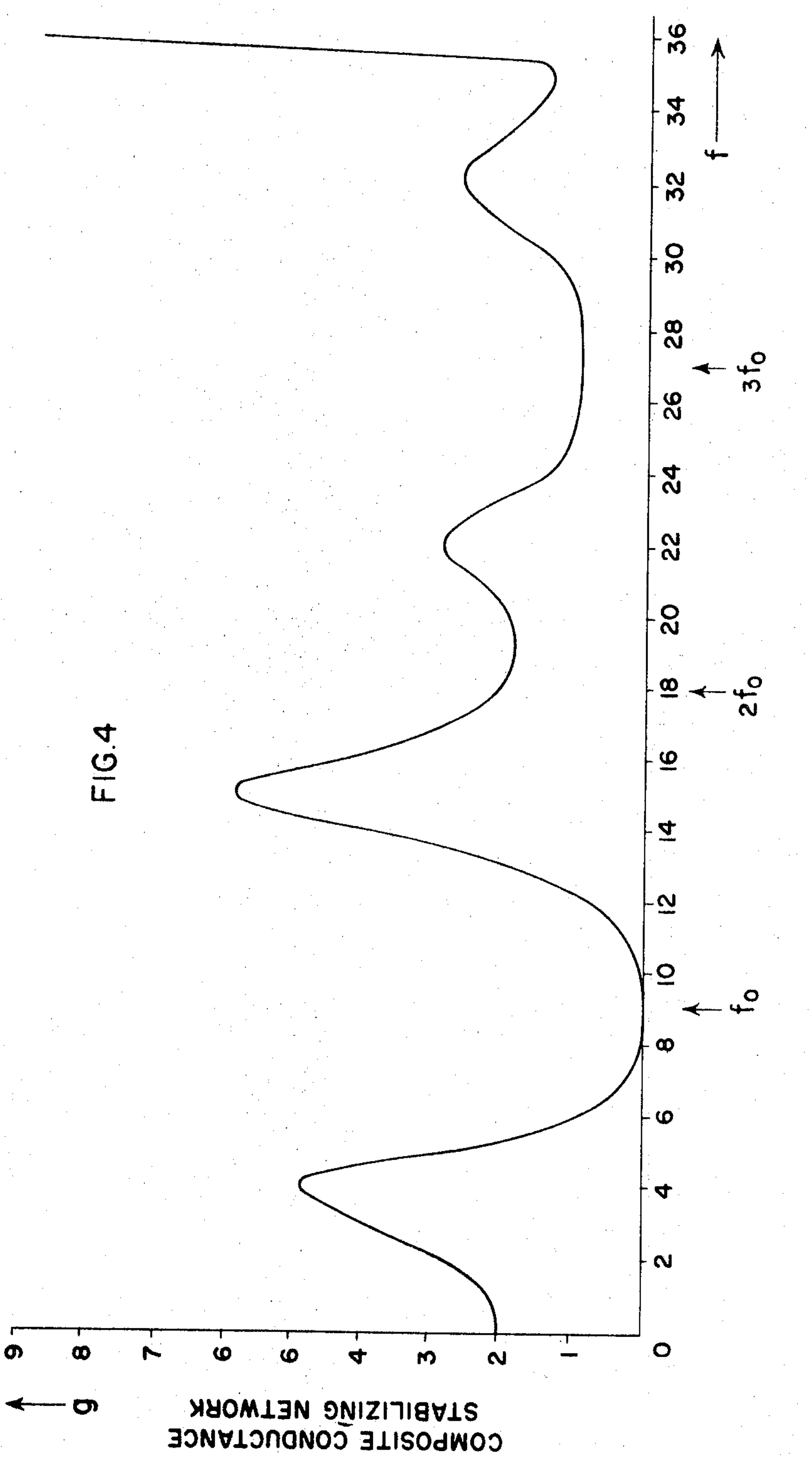
FIG. 4 is a curve illustrating the composite conductance vs. frequency characteristics of the stabilizing network in the circuit of FIGURE 3.

In FIG. 4 there is illustrated the composite conductance vs. frequency characteristic of the stabilizing network 33 for one operable embodiment of the circuit in which there was a signal frequency of 9 gHz. From the curve it can be seen that the conductance exceeds unity, which value is normalized to the strip line characteristic admittance, for all frequencies outside of the 6 to 12 gHz. frequency band from DC to diode cut off frequency, normally three to four times the signal frequency. For values exceeding unity, the positive conductance of the stabilizing network, being effectively in shunt with the tunnel diodes, compensates their negative conductance and thereby contribute to circuit stability. At the signal frequency and for those frequencies within the signal band for which the stabilizing network conductance is less than unity, the characteristic admittance $Y_0$ of the circulator provides the necessary positive conductance for maintaining circuit stability.

Considering the specific operation of each branch of the stabilizing network, the stabilizing branch 34 is open-ended and has two quarter wavelength sections, or odd multiples thereof, with the characteristic impedance of the strip line structure provided by the shunt pair of resistors 36 and 37 connected at the midpoint of the branch. Accordingly, at the signal frequency the open circuit at the end of the branch is reflected back so as to appear as a short circuit across the resistors 36 and 37. In turn, the short circuit is reflected back as an open circuit across the terminals of the tunnel diodes 5' and 6'. The diodes are thus not loaded by the stabilizing branch 34 at the signal frequency. At the second harmonic of the signal frequency, the open end is reflected back so as to appear as an open circuit across the resistors 36 and 37. At this frequency the tunnel diodes are shunted by the characteristic impedance of the strip line and a stabilizing effect is achieved. It is noted that the second harmonic frequency is outside of the pass band of the circulator, which for the described embodiment is approximately 6 to 12 gHz., so that the circulator does not contribute to stabilization at this frequency. Stabilization must be entirely provided by the stabilizing network. At the third harmonic of the signal frequency the open end is again reflected back across the tunnel diodes as an open circuit. No stabilizing property is therefore provided by the branch 34 at the odd harmonic frequencies. This stabilization is provided by branch 35.

The stabilizing branch 35 has been seen to include an impedance transformation section 3/16 wavelength long and a quarter wavelength section, with resistors 38 and 39 of a value equal to the characteristic admittance of the strip line, separating the two sections. At the signal frequency the open end of branch 35 is reflected back through the 1/8 wavelength sub-section, the impedance transformation interface and 1/16 wavelength sub-section so as to appear as a short across the resistors 38 and 39. The short circuit is further reflected back so as to appear as an open circuit across the tunnel diode terminals. At the third harmonic of the signal frequency the open end is reflected back as a zero conductance across the resistors 38 and 39, so as to shunt the tunnel diodes with the characteristic impedance of the strip line, and thereby achieve a stabilizing effect.

The requisite characteristics of the stabilizing network 33 can be achieved by other configurations than that specifically described, which nevertheless fall within the principles herein presented. For example, in an alternative embodiment, the 1/16 $\lambda$ sub-section of the branch 35 was replaced by a 3/16 $\lambda$ sub-section and the impedance transformation ratio changed to 1/2.41.

Figure 5:
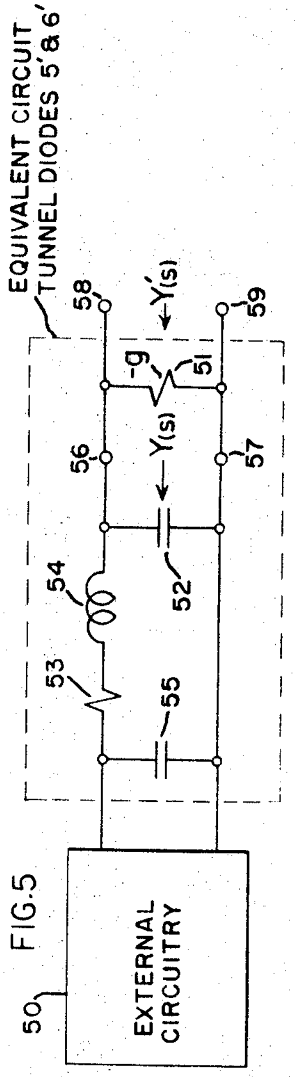
FIG. 5 is an equivalent circuit diagram of the tunnel diode devices of FIGURE 3 connected to their associated circuitry.

The stability criteria for the illustrated tunnel diode amplifier circuit may be obtained from the following considerations. For this discussion reference will be made to FIG. 5 which illustrates the equivalent circuit of the tunnel diodes 5' and 6' of FIG. 3, in combination with the connected external circuitry which is included in block 50. The equivalent circuit of the tunnel diodes is seen to include a shunt negative conductance 51, a shunt junction capacitance 52, a series resistance 53, series inductance 54 and a shunt case capacitance 55. It is desirable that the series inductance parameter be of lowest possible value for purposes of stabilization. The external circuit 50 may be understood to primarily include the circulator, tuning circuits, stabilizing circuits and bias circuit.

For purpose of analysis, terminals 56 and 57 are located between negative conductance 51 and capacitor 52 to permit calculation of the input admittance $Y_{IN}$ of the circuit exclusive of the negative conductance. Terminals 58 and 59 are located outside of conductance 51 to permit calculation of the input admittance $Y_{IN}$ of the entire circuit. Accordingly, the admittance $Y_{IN}$ may be expressed in the $s$ plane as $$Y_{(s)}=\frac{P_{(s)}}{Q_{(s)}} \qquad (4)$$

Since $Y_{(s)}$ is the admittance of a passive network, it is known the zeros and poles of the function must be only in the left hand half of the $s$ plane.

The admittance $Y'_{IN}$ may be expressed in the $s$ plane as $$\begin{aligned} Y'_{(s)} &= Y_{(s)}+(-g) \\ &= \frac{P_{(s)}-gQ_{(s)}}{Q_{(s)}} \end{aligned} \qquad (5)$$

In order for the circuit to be stable it is required that the zeros and poles of $Y'_{(s)}$ not be in the right hand half plane of the $s$ plane. Stated otherwise, it is required that $P_{(s)}-gQ_{(s)}$ and $Q_{(s)}$ not have zeros in the right hand half plane. Since $Q_{(s)}$ does not have zeros in the right hand half plane it can be conveniently determined whether $P_{(s)}-gQ_{(s)}$ has zeros in the right hand plane. This is done by resorting to a Nyquist plot, which is a plot of the imaginary and real parts of the admittance of a circuit, in this case $Y'_{IN}$, as a function of frequency. The number of encirclements about the origin in the Nyquist plot for the function $Y'_{IN}$ corresponds in the $s$ plane to the summation of the number of zeros in the right hand half plane minus the summation of the number of poles in the right hand half plane. Since it has been found that there are no poles in the right hand plane, the circuit is made stable by avoiding encirclement of the origin in the Nyquist plot.

It has been found that by a simple adjustment of the tuning of the amplifier circuit a stable operation can be readily obtained. The employed stabilizing network 33 permits adjustment of $Y'_{IN}$ so as to avoid encirclement of the origin in the Nyquist plot, and thereby assure stability, by merely tuning the circuit through the stub tuners that are provided. Further, a wide range of stable tuning is made possible so that in the tuning operation considerable flexibility is permitted with respect to adjusting the gain and setting the tuning of the circuit to a desired frequency.

A typical embodiment of the tunnel diode amplifier circuit illustrated in FIG. 3 employs the following circuit components and parameters for a signal operating frequency of 9 gHz., these being given for the purposes of example and not to be construed as limiting.

Tunnel diodes 5' and 6'—X-band type
Strip line characteristic impedance—50 ohms
Resistors 36, 37, 38 and 39—100 ohms
Resistors 16, 28 and 31—50 ohms
Resistors 27 and 30—about 1 kilohm
Voltage batteries 7' and 8'—1.5 volts
Capacitances 22, 23, 29, 32, 40, 41, 44, 45, 47 and 48—at X-band, several picofarads
Line length $l_2$—.149 λ
Line length $l_4$—.24 λ
Line lengths $l_1$, $l_3$ and $l_5$—variable about .25 λ

The illustrated circuit has been found to increase the 1 db gain compression point by 10 db over conventional signal diode amplifiers. Further, an improvement of 20 db in the intermodulation product has been achieved, measured with two signals of equal power levels.

Referring now to FIGS. 6A, 6B and 6C, there is illustrated the structure for one exemplary embodiment of the present tunnel diode amplifier circuit, absent the circulator. The tunnel diode circuit is enclosed by a cast aluminum housing 60 comprising two mating sections 61 and 62, shown separated in the perspective view of FIG. 6A. Section 61 houses the main portion of the circuit's strip line structure which includes a pair of thin layer dielectric boards 63 and 64, superimposed one upon the other. The boards are typically a fiber glass reinforced Teflon. As shown in the exploded view of FIG. 6B, one side of board 63 has coated thereon a strip conductor 65 of a given geometrical configuration, which corresponds to the center conductor 12 in FIG. 3. The strip conductor 65 includes arms 66 and 67 which are part of the stabilizing network and arms 68, 69 and 70 which form part of the tuning structure. The nonuniform width of arm 67 provides the desired impedance transformation ratio. The opposing side of dielectric board 63 is provided with a continuous conductive coating, not shown in FIG. 6B, and forms a first RF ground conductor corresponding to conductor 10. The second dielectric board 64 has a continuous conductive coating 71 on one side thereof forming a second RF ground conductor corresponding to conductor 11, the opposing side being uncoated. Board 64 overlays board 63 with its dielectric surface in contact with the strip conductor 65 and having cut out portions 72, 73 and 74 in coincidence with tuning arms 68, 69 and 70, respectively.

Section 62 contains three conductive plungers 75, 76 and 77 which when the housing is closed fit within the cut out portions and make contact with the tuning arms. The plungers 75, 76 and 77 are mechanically actuated by adjusting screws 78 to slide along the strips 68, 69 and 70 and thereby vary the length of the tuning arms. The plungers are short circuited to the housing structure which is at DC ground.

Referring once more to section 61 a coaxial connection is made through an opening provided in the housing to the strip conductor 65 at point A. At point B are located the pair of tunnel diodes, the diodes being inserted through openings in the boards 63 and 64. Similarly, the stabilizing resistors are inserted through openings in the boards 63 and 64 at points C and D. As best shown in the cross sectional view of FIG. 6C taken along the plane 6C—6C in FIG. 6A, tunnel diodes 5' and 6' contact the RF ground planes 71 and 80 and the center strip conductor 65 by short conductive strips 81, 82 and 83, Corresponding contacts to the center conductor and RF ground conductors are provided for stabilizing resistors 36 through 39.

An opening 85, shown in FIG. 6A, is provided in the housing 60 for introducing the DC bias voltage between the ground conductors and the strip line center conductor. The mating surfaces of the two sections 61 and 62 of the housing are anodized for providing DC isolation, the anodized surface acting as the dielectric for the illustrated RF bypass capacitances. In addition, a recessed area 86 is provided in section 62 for accommodating the strip line structure of section 61 and thus permit the mating surfaces of the two sections to be in close contact. This minimizes the undesirable shunt capacitance of the housing structure. Alignment pins 87 and 88 engage holes 89 and 90.

What I claim as new and desire to secure by Letters Patent of the United States is:

1. A single port tunnel diode amplifier circuit employed in a microwave structure, comprising:

(a) a pair of tunnel diodes of approximately matching electrical characteristics serially connected with the same polarity between two conductors which are each at RF ground potential, the junction of said diodes being on a center conductor, (b) DC bias means, (c) means for coupling said DC bias means to the two RF ground conductors so as to forward bias said diodes in their negative resistance region and provide a composite voltage versus current characteristic for said diodes having the linear portion of its negative resistance region appreciably extended relative to that of a single diode, (d) means for coupling an RF signal source to said single port, which is between said center conductor and a further point of the circuit at a DC reference potential, so that said diodes are in parallel with respect to said signal source and in a balanced bridge configuration with respect to said DC bias means, (e) means for obtaining the amplified RF signal from said single port, and (f) a stabilizing network coupled across said tunnel diodes for jointly stabilizing said diodes, said network exhibiting approximately zero admittance at a given signal frequency and a finite positive admittance for all other frequencies between DC and the cut-off frequency of the diodes of a sufficient magnitude to ensure stable operation of said amplifier circuit.

2. A tunnel diode amplifier circuit as in claim 1 wherein said stabilizing network is formed by the RF ground conductors and said center conductor and includes a first open-ended branch having first and second sections of quarter-wavelength each with a first stabilizing impedance means connected across said RF ground and center conductors at the junction of said sections, whereby said first branch reflects back across said tunnel diodes a zero admittance at the fundamental frequency of the signal and a finite positive conductance at the second harmonic frequency of the signal.

3. A tunnel diode amplifier circuit as in claim 2 wherein said stabilizing network includes a second open-ended branch having third and fourth sections with a second stabilizing impedance means connected across said RF ground and center conductors at the junction of said third and fourth sections, said third section being of quarter wavelength, said fourth section providing an impedance transformation so as to exhibit a length of one-quarter wavelength at the fundamental frequency of the signal and a length differing from one quarter wavelength at the third harmonic frequency of the signal whereby said second branch reflects back across said tunnel diodes a zero admittance at said fundamental frequency and a finite positive conductance at said third harmonic frequency.

4. A tunnel diode amplifier circuit as in claim 3 wherein said first and second stabilizing impedance means have each a magnitude equal to the characteristic impedance of the circuit.

5. A tunnel diode amplifier circuit as in claim 4 which further includes a plurality of tuning stubs formed integral with said RF ground and center conductors.

6. A tunnel diode amplifier circuit as in claim 5 which includes an input-output means coupled to said RF ground and center conductors.

7. A tunnel diode amplifier circuit as in claim 6 wherein said microwave structure is in a strip line configuration, said RF ground conductors being a pair of ground planes and said center conductor being a strip conductor spaced by dielectric means from said RF ground conductors.

References Cited

UNITED STATES PATENTS 3,141,138 7/1964 Oshima et al.
3,227,955 1/1966 Yasuda et al. ______ 307—322 X

FOREIGN PATENTS 1,273,078 8/1961 France.

NATHAN KAUFMAN, Primary Examiner

U.S. Cl. X.R.

307—322; 330—34